(12) United States Patent
Craven et al.

(10) Patent No.: US 11,095,304 B2
(45) Date of Patent: Aug. 17, 2021

(54) DISCRETE DITHER

(71) Applicant: MQA Limited, London (GB)

(72) Inventors: Peter Graham Craven, Haslemere (GB); Malcolm Law, West Sussex (GB)

(73) Assignee: MQA Limited, London (GB)

( * ) Notice: Subject to any disclaimer, the term of this patent is extended or adjusted under 35 U.S.C. 154(b) by 0 days.

(21) Appl. No.: 16/718,802

(22) Filed: Dec. 18, 2019

(65) Prior Publication Data

US 2020/0195272 A1  Jun. 18, 2020

(30) Foreign Application Priority Data

Dec. 18, 2018 (GB) ................................ 1820620

(51) Int. Cl.
| | | |
|---|---|---|
| *H03M 1/20* | (2006.01) | |
| *H03M 7/32* | (2006.01) | |
| *H03M 1/12* | (2006.01) | |
| *H03M 1/06* | (2006.01) | |
| *H03M 3/00* | (2006.01) | |

(52) U.S. Cl.
CPC ........ *H03M 7/3008* (2013.01); *H03M 7/3028* (2013.01); *H03M 1/0641* (2013.01); *H03M 1/12* (2013.01); *H03M 3/30* (2013.01)

(58) Field of Classification Search
CPC ......... H03M 1/0641; H03M 1/12; H03M 3/30
USPC ................................. 341/131, 155, 126, 143
See application file for complete search history.

(56) References Cited

U.S. PATENT DOCUMENTS

| | | | | |
|---|---|---|---|---|
| 7,031,401 | B2* | 4/2006 | Lambert | H03M 7/3008 375/295 |
| 10,686,996 | B2* | 6/2020 | Liu | H04N 5/3559 |
| 2011/0135218 | A1* | 6/2011 | Moore | H04N 5/357 382/275 |

FOREIGN PATENT DOCUMENTS

GB 2451474 A 2/2009

OTHER PUBLICATIONS

Great Britain Combined Search and Examination Report dated Jul. 23, 2019 which was issued in connection with GB 1820620.1 which was filed on Dec. 18, 2018.
Pengfei Wan: "High Bit-Precision Image Acquisition and Reconstruction by Planned Sensor Distortion", IEEE International Conference on Image Processing, 2014, pp. 1773-1777.
Yevhen Zolotavkin: "A New Two-Dimensional Quantization Method for Digital Image Watermarking", 17th International Conference on Advanced Communication Technology, pp. 155-160.
J. Robert Stuart: "The Genial Art of Dithering", J. Audio Eng. Soc., vol. 67, No. 5, May 2019.

* cited by examiner

*Primary Examiner* — Joseph J Lauture
(74) *Attorney, Agent, or Firm* — Buckley, Maschoff & Talwalkar LLC

(57) ABSTRACT

Quantisation methods are provided which employ dither techniques to reduce the noise penalty in certain circumstances whilst still removing noise modulation. One method relates to reducing the wordwidth of audio by one bit, while another method relates to burying one bit of data in a pair of signal samples.

6 Claims, 3 Drawing Sheets

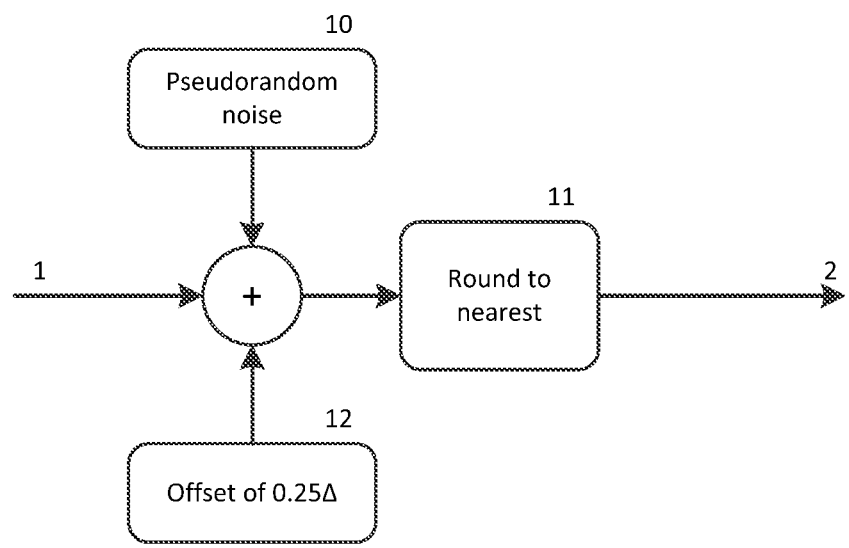
Fig. 3
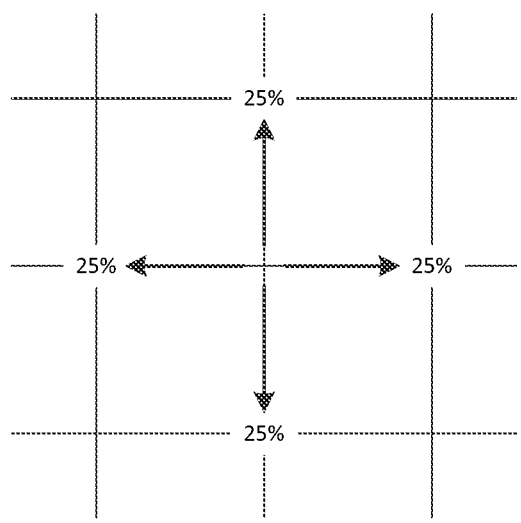 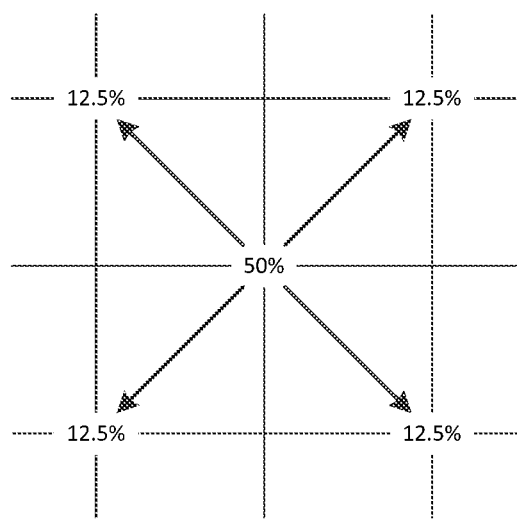
Fig. 4A          Fig. 4B

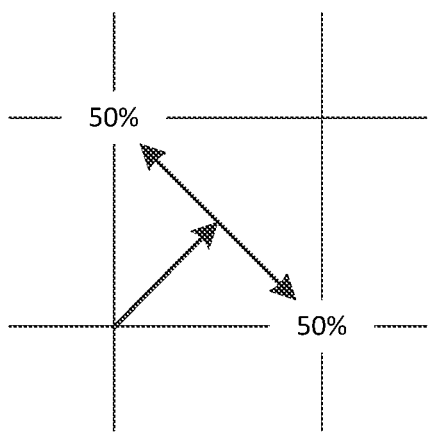
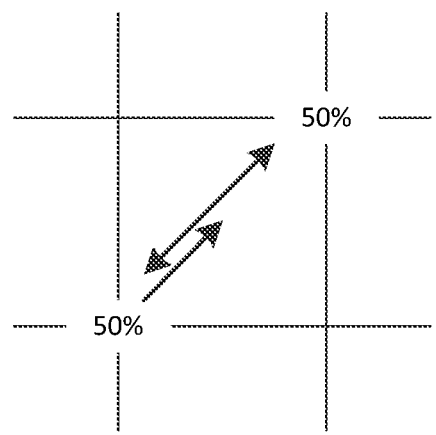
*Fig. 5A*  *Fig. 5B*

DISCRETE DITHER

CROSS-REFERENCE TO RELATED APPLICATIONS

This application is based on and claims priority to GB Application No. 1820620.1 for "DISCRETE DITHER" filed Dec. 18, 2018, the entire contents of which are incorporated herein by reference.

FIELD OF THE INVENTION

The invention relates to the quantisation of audio signals using dither, and particularly to the reduction of noise.

BACKGROUND OF THE INVENTION

It is well known that quantisation of audio can result in objectionable artifacts. These are commonly ameliorated by incorporating a suitable noise signal known as dither into the quantiser. Addition of dither with a rectangular probability density function (RPDF) spanning one quantisation step makes the resultant quantisation error uncorrelated with the signal but the dithered quantiser may still exhibit noise modulation. Changing the dither to a triangular probability density function (TPDF) spanning two quantisation steps also removes the noise modulation.

However these steps come with a noise penalty, a RPDF dithered quantiser is typically 3 dB noisier than an undithered quantiser and a TPDF dithered quantiser 4.77 dB noisier.

It is an object of the current invention to reduce the noise penalty in certain circumstances whilst still removing all noise modulation.

SUMMARY OF THE INVENTION

The invention pertains to reducing the wordwidth of audio by one bit. For example, this might be reducing 17 bit audio to 16 bits. Or it might be to subtractively embed data into the audio as a fragile watermark.

According to a first aspect of the invention, there is provided a quantisation method for reducing the wordwidth of audio by one bit comprising the step of pseudo-randomly choosing one of two adjacent output values such that the probability of choosing one of them is 75% and the probability of choosing the other is 25%.

In this way, the noise introduced into the output audio is constant yet less than would be expected from the common practice of TPDF dithered quantisation.

According to a second aspect of the invention, there is provided a quantisation method for burying one bit of data in a pair of signal samples comprising the steps of: identifying two possible 2-tuples of output values both of which convey said one bit of data, and pseudo-randomly choosing one of the two possible 2-tuples with 50% probability.

In this way there is uncertainty and hence quantisation error in the output regardless of whether the pair of signal values would be interpreted as containing the desired bit of data or not. There is therefore the possibility of avoiding the noise modulation that would arise if the method specified no signal modification in the eventuality that the signal pair already conveys the desired bit. And yet since the selection is between two possibilities rather than the four neighbours that naturally occur in two dimensions, the noise can be lower than expected.

According to a third aspect of the invention, there is provided a non-transitory computer readable medium comprising instructions that when executed by one or more processors, cause said one or more processors to implement the method of the first aspect.

According to a fourth aspect of the invention, there is provided a non-transitory computer readable medium comprising instructions that when executed by one or more processors, cause said one or more processors to implement the method of the second aspect.

BRIEF DESCRIPTION OF THE DRAWINGS

Examples of the present invention will now be described in detail with reference to the accompanying drawings, in which:

FIG. 3 shows how the invention incorporates a carefully chosen offset which allows the dithered quantisation to have a constant variance independent of the input level yet lower than the prior-art TPDF dither;

FIGS. 4A and 4B show how a prior art watermarker might embed one data bit into two samples of audio as the XOR of their lsbs. In FIG. 4A, the input pair of samples does not embed the desired value, whereas in FIG. 4B the input pair of samples does embed the correct value; and, FIGS. 5A and 5B show how a watermarker according to the invention embeds one data bit into two samples, by applying a suitable offset to the mean output value.

DETAILED DESCRIPTION

Figure 1:
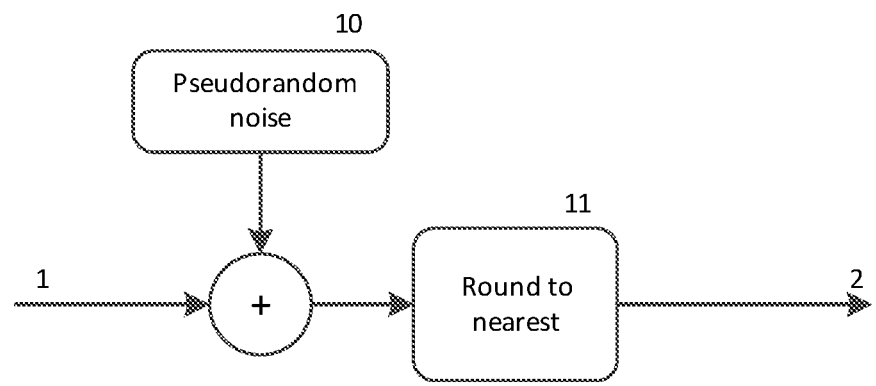
FIG. 1 (prior art) shows how a dithered quantiser adds dither to a high precision input signal prior to selecting the nearest representable output value.

FIG. 1 shows how a dithered quantiser adds pseudorandom dither (10) to a high precision input signal (1) prior to selecting (11) the nearest output value (2). We shall denote the quantiser step size as $\Delta$.

Figure 2:
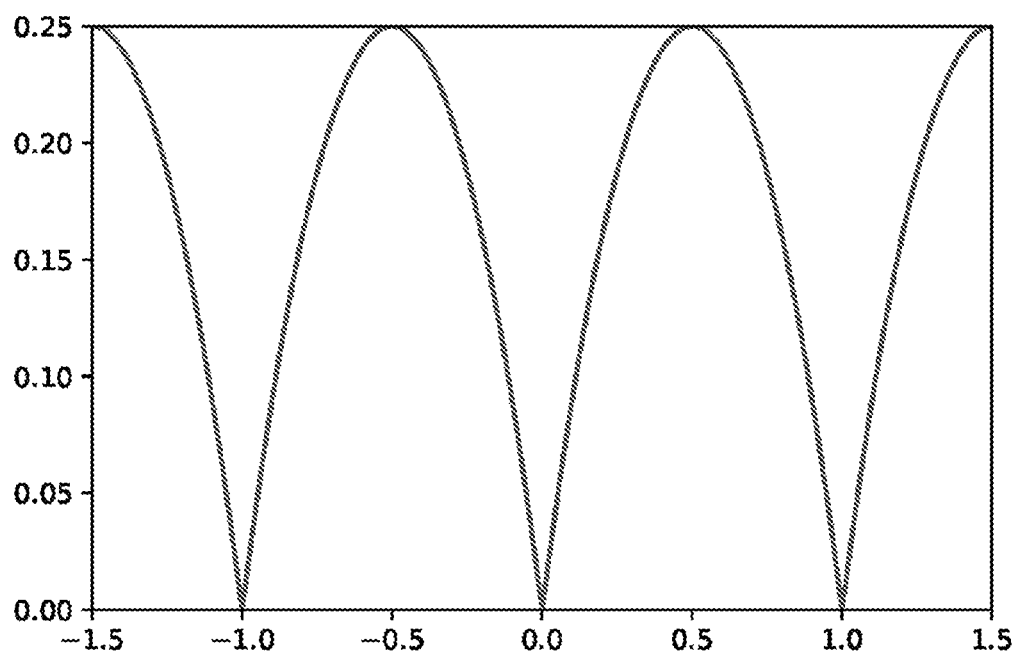
FIG. 2 (prior art) shows how, when the dither is RPDF spanning one quantisation step size, the error power of the dithered quantiser varies with the high precision input.

It is well known that if the overall expected error of the dithered quantiser is required to be zero, then the noise power from the dithered quantisation cannot be less than the values shown in FIG. 2, and that these values are achieved by choosing the pseudorandom noise (10) to be RPDF spanning a range from $-0.5\Delta$ to $+0.5\Delta$.

It is also well known that it is further desirable for the dithered quantiser to have constant noise power. Since when the input level is exactly midway between permissible output values, the noise power cannot be less than $0.25\Delta^2$ this is achieved in the prior art by increasing the noise power up to $0.25\Delta^2$ for other input values by randomly selecting from 3 output values. One way to implement this is by making the pseudo-random noise source (10) have a triangular pdf (probability density function) spanning $-\Delta$ to $+\Delta$.

When the input (1) is already quantised to one more bit than the output (2) there are only two cases to consider:

i) The input is $x+0.5\Delta$ for some permissible output value x. In this case both the above recipes lead to choosing an output of x with 50% probability or x+1 with 50% probability. The output value has mean $x+0.5\Delta$ which matches the input, and variance $0.25\Delta^2$.

ii) The input is some permissible output value x. In this case the RPDF recipe outputs x with 100% probability. This has zero variance, which differs from the prior case and hence the RPDF recipe exhibits noise modulation. The TPDF recipe outputs one of $\{x-1, x, x+1\}$ with probability $\{25\%, 50\%, 25\%\}$. This still preserves the mean output value but increases the variance to $0.25\Delta^2$ which removes the noise modulation.

According to the invention, the dithered quantiser incorporates a constant offset of $0.25\Delta$. A small DC offset is immaterial to audio, but this small but crucial relaxation allows the variance to be constant but at a lower level than the triangular dithered prior art.

If we now reconsider the two cases:

i) The input is $x+0.5\Delta$ for some permissible output value x. We output x with 25% probability or $x+1$ with 75% probability. The mean output is $x+0.75\Delta$ but the variance is $0.1875\Delta^2$ ii) The input is some permissible output value x. We output x with 75% probability or $x+1$ with 25% probability. The mean output is $x+0.25\Delta$ and the variance is $0.1875\Delta^2$ We thus have a constant expected error from the dithered quantiser and a constant variance of the output. However, this variance is 1.25 dB lower than that produced by a triangular dithered quantiser.

One possible implementation of this is shown in FIG. 3. The high precision input (1) has one more bit of precision than the output (2) and the pseudorandom noise (10) is RPDF spanning $-0.5\Delta$ to $+0.5\Delta$. The offset (12) of $0.25\Delta$ ensures that quantisation decisions are made as described above.

The pseudo-random noise can take discrete values instead of continuous with exactly the same outcome. Possible ways of achieving the outcome described above are 4 equally possible values $\{-0.375\Delta, 0.125\Delta, 0.375\Delta\}$ or 3 unequally probable values $\{-0.5\Delta, 0, 0.5\Delta\}$ with probabilities $\{25\%, 50\%, 25\%\}$.

The offset (12) can also be incorporated into the pseudo-random noise before adding to the signal.

The above procedure generalises to the case where the input precision exceeds the output by k bits where k>1. In this case the offset (12) is chosen as $2^{-(k+1)}\Delta$ and the pseudorandom noise might take values $2^{-k}n\Delta$ with probability $(2^k-|n|)2^{-2k}$ for integer $-2^k<n<2^k$. As k increases, this approaches a continuous TPDF distribution and the variance advantage over a normal TPDF dithered quantiser decreases.

One scenario where quantisation reducing precision by a single bit can occur is embedding data into the audio lsb (least significant bit), for example into the 24$^{th}$ bit as a fragile watermark. Reducing the variance of this embedding increases the transparency of the watermark.

In this scenario, the desired data bit can be subtracted from an audio sample. This is then quantised to 23 bits as described above and the desired data bit added back. This subtractive method ensures that the lsb of the audio holds the desired data and yet the whole procedure has constant expected error (independent of both the data bit and the original audio lsb) and a small variance.

The invention is also applicable for embedding data at a lower data rate, for example one data bit in a single stereo sample (or two consecutive samples on a single channel). This might be done by defining the embedded data bit to be the XOR of the lsbs of the two samples.

A prior art approach is illustrated in FIGS. 4A and 4B, which show how a prior art watermarker might embed one data bit into two samples of audio as the XOR of their lsbs. In FIG. 4A, the input pair of samples does not embed the desired value so one of the four neighbours is selected with equal probability. In FIG. 4B, the input pair of samples does embed the correct value. However to keep a constant variance, one of the four more distant neighbours is sometimes selected.

We first consider if the pair of lsbs already convey the desired value. If they do not, then one lsb needs changing to embed the value. There are four ways to do this with minimum error, by adding or subtracting A from either channel. The expected error is held zero by making adding and subtracting equally likely, the error variance is $\Delta^2$ and can be distributed evenly across both channels by randomly choosing which channel to alter. The net result is that the four neighbours are chosen each with 25% probability.

If they do contain the correct value, then the sample pair can be left unchanged. But if we are to have constant variance, then with 50% probability we must alter both samples by $\pm\Delta$. There are four ways to do this, which we do with 25% probability each.

According to the invention however, we introduce an offset of $0.5\Delta$ on both samples, as illustrated in FIGS. 5A and 5B. By applying a suitable offset to the mean output value, the correct value can be embedded by selecting from one of two pairs of values with constant variance that is lower than in FIG. 4. Now there are four neighbours, two of which embed one value for the embedded bit and two of which have the other. We can make a 50% choice between the two neighbours with the desired embedded value. This approach has a constant mean error and variance $0.5\Delta^2$—half that generated by the prior art approach.

Further relevant information may be found in J. R. Stuart and P. G. Craven, "The Gentle Art of Dithering", J. Audio Eng. Soc., vol. 67, no. 5, pp. 278-299, (2019 May), particularly the Appendix, the contents of which are incorporated herein by reference.

Any of the methods described herein may be implemented by one or more processors executing instructions stored on a non-transitory data storage device or computer readable medium, the instructions causing the one or more processors to implement the respective methods.

Numerous modifications, adaptations and variations to the embodiments described herein will become apparent to a person skilled in the art having the benefit of the present disclosure, and such modifications, adaptations and variations that result in additional embodiments of the present invention are also within the scope of the accompanying claims.

The invention claimed is:

1. A quantisation method for reducing the wordwidth of an input audio signal to an output audio signal by one bit, the method comprising the step of:

pseudo-randomly choosing one of two adjacent output values such that the probability of choosing one of them is 75% and the probability of choosing the other is 25% wherein a first noise signal introduced into the output audio signal is approximately constant and is lower than a second noise expected to be introduced by a Triangular Probability Density Function (TPDF) dithered quantization.

2. A quantisation method for burying one bit of data in an input audio signal comprising a pair of signal samples to generate an output signal, the method comprising the steps of:

identifying two possible 2-tuples of output values both of which convey said one bit of data; and pseudo-randomly choosing one of the two possible 2-tuples with 50% probability wherein a first noise signal introduced into the output audio signal is approximately constant and is lower than a second noise expected to be introduced by a Triangular Probability Density Function (TPDF) dithered quantization.

3. The quantisation method according to claim 2, wherein said two possible 2-tuples differ by exactly one quantisation step in both dimensions.

4. A non-transitory computer readable medium comprising instructions for reducing the wordwidth of an input audio signal to an output audio signal by one bit that, when executed by one or more processors, cause said one or more processors to:
   pseudo-randomly choose one of two adjacent output values such that the probability of choosing one of them is 75% and the probability of choosing the other is 25% wherein a first noise signal introduced into the output audio signal is approximately constant and is lower than a second noise expected to be introduced by a Triangular Probability Density Function (TPDF) dithered quantization.

5. A non-transitory computer readable medium comprising instructions for burying one bit of data in an input audio signal comprising a pair of signal samples to generate an output signal that, when executed by one or more processors, cause said one or more processors to:
   identify two possible 2-tuples of output values both of which convey said one bit of data; and
   pseudo-randomly choose one of the two possible 2-tuples with 50% probability wherein a first noise signal introduced into the output audio signal is approximately constant and is lower than a second noise expected to be introduced by a Triangular Probability Density Function (TPDF) dithered quantization.

6. The non-transitory computer readable medium according to claim 5, wherein said two possible 2-tuples differ by exactly one quantisation step in both dimensions.

* * * * *